United States Patent [19]
Auge De Fleury et al.

[11] Patent Number: 6,145,445
[45] Date of Patent: Nov. 14, 2000

[54] RAIL VEHICLE BOGIE, A METHOD OF MACHINING THE BOGIE, AND A TOOL FOR IMPLEMENTING THE METHOD

[75] Inventors: Bernard Auge De Fleury, Noisy le Grand; Jean-Claude Bouttemy, Issy les Moulineaux; Joan-Yves Zliechovec, Seugy, all of France

[73] Assignee: GEC Alsthom SA, Paris, France

[21] Appl. No.: 09/168,103

[22] Filed: Oct. 8, 1998

[30]   Foreign Application Priority Data

May 18, 1998 [FR] France ................................... 98 06257
Jun. 9, 1998 [FR] France ................................... 98 07245

[51] Int. Cl.[7] ........................................................ B61F 3/00
[52] U.S. Cl. ................................. 105/199.5; 105/182.1; 324/174; 340/870.31
[58] Field of Search .............................. 105/199.5, 463.1, 105/199.3, 182.1; 180/282; 340/870.31; 310/168; 318/618, 660; 324/174

[56]          References Cited

U.S. PATENT DOCUMENTS

| | | | |
|---|---|---|---|
| 3,728,565 | 4/1973 | O'Callaghan | 310/168 |
| 3,884,157 | 5/1975 | Pelabon | 105/199.5 |
| 3,930,201 | 12/1975 | Ackermann et al. | 310/168 |
| 4,170,945 | 10/1979 | Kayserling | 105/199.5 |
| 4,203,632 | 5/1980 | Fabreges | 180/282 |
| 5,289,120 | 2/1994 | Moretti et al. | 324/174 |
| 5,578,801 | 11/1996 | Hofmann | 187/393 |
| 5,898,388 | 4/1999 | Hofmann et al. | 340/870.31 |
| 5,941,174 | 8/1999 | Rodet | 105/199.5 |

FOREIGN PATENT DOCUMENTS

0958984 A1  11/1999  European Pat. Off. .

*Primary Examiner*—S. Joseph Morano
*Assistant Examiner*—Lars A. Olson
*Attorney, Agent, or Firm*—Sughrue, Mion, Zinn, Macpeak & Seas, PLLC

[57]          ABSTRACT

The bogie comprises an axle (14) rotatably mounted on a fixed underframe, and measurement apparatus for measuring a physical magnitude related to rotation of the axle (14). The measurement apparatus (34) comprises a metal disk (36) secured to the axle (14) and provided with at least one mark-forming perforation (40), and a fixed detection assembly (50) for detecting the mark, which assembly comprises at least one inductive proximity detector (52). Preferably, the disk (26) is fixed to a collector ring (26) of a current return assembly (24) for transferring the current coming from a motor of the bogie to the axle (14).

13 Claims, 5 Drawing Sheets

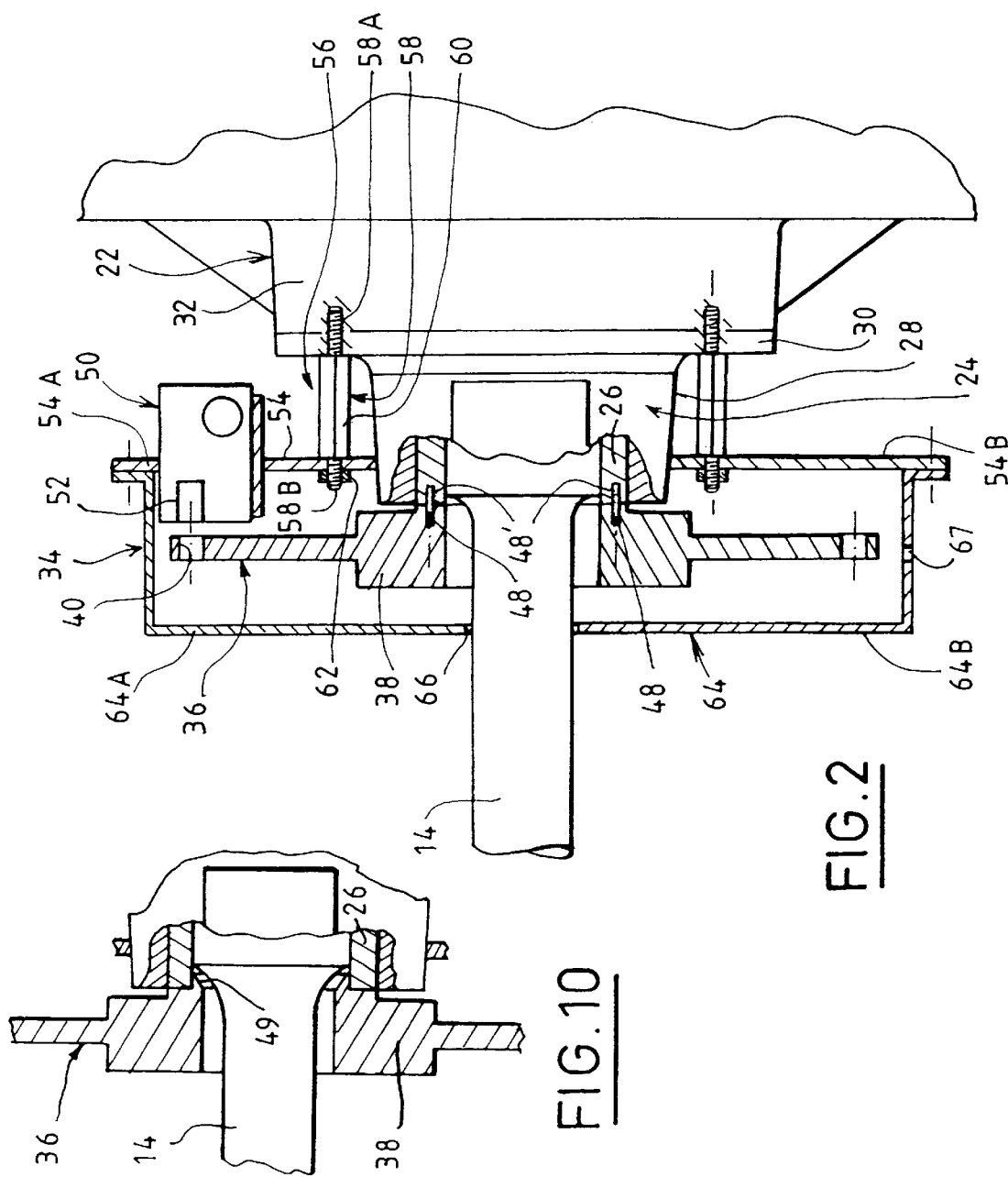

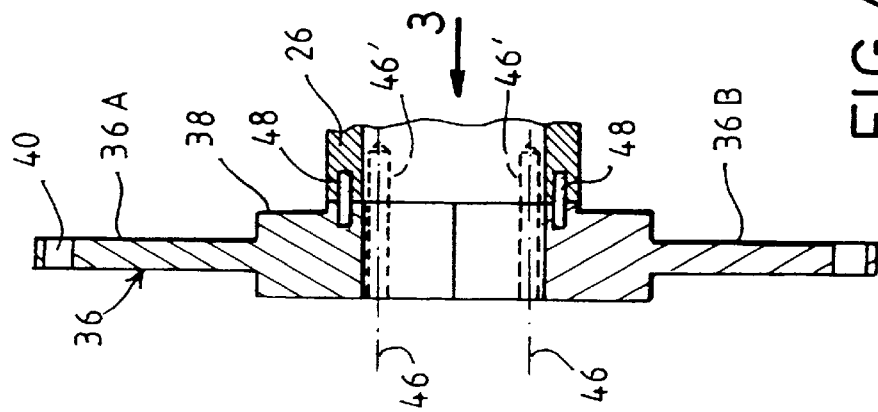
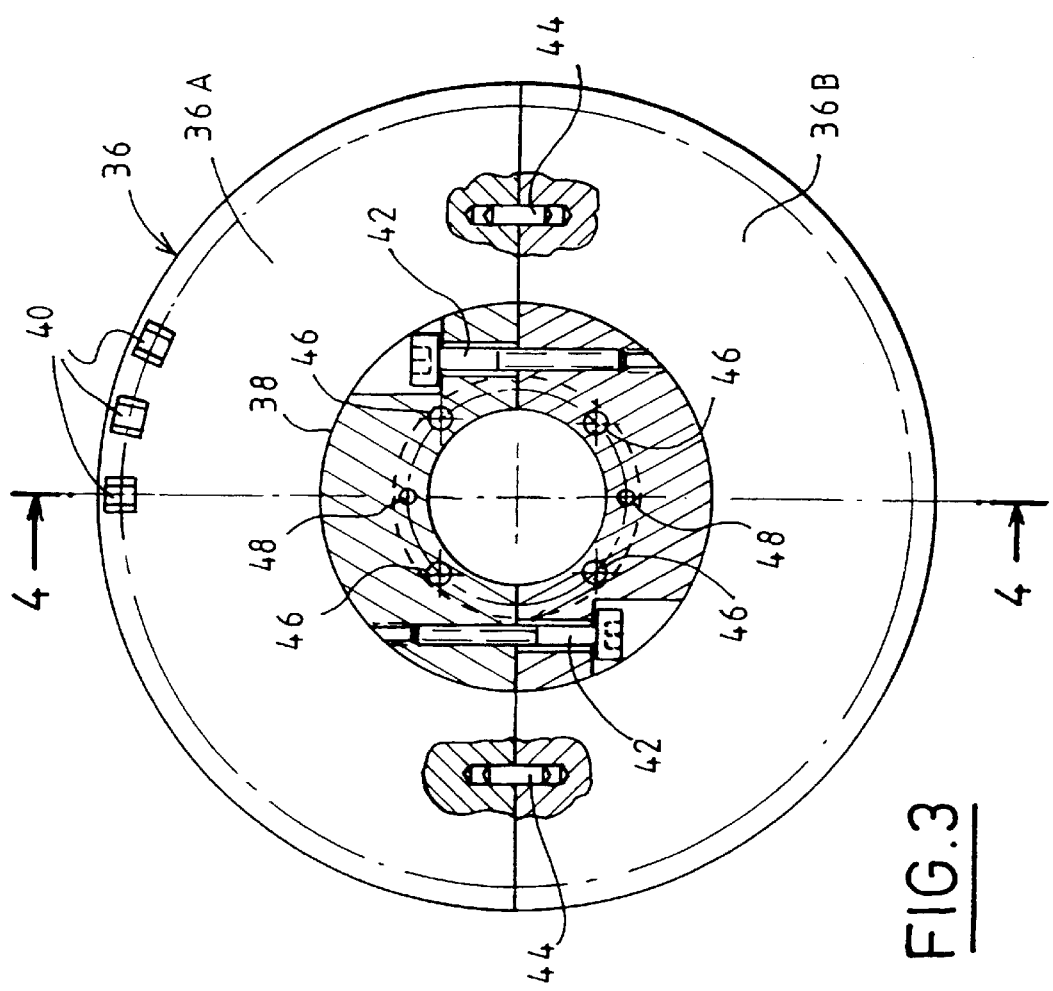

RAIL VEHICLE BOGIE, A METHOD OF MACHINING THE BOGIE, AND A TOOL FOR IMPLEMENTING THE METHOD

BACKGROUND OF THE INVENTION

The present invention relates to a rail vehicle bogie, to a method of machining the bogie, and to a tool for implementing the method.

From the state of the art, it is already known that a rail vehicle bogie can be of the type comprising a fixed underframe, at least one axle rotatably mounted on the underframe, and measurement apparatus for measuring a physical magnitude related to rotation of the axle, which measurement apparatus comprises a disk secured to the axle and provided with at least one mark-forming perforation, and a fixed detection assembly for detecting the mark, which assembly is carried by the underframe.

In conventional manner, the measurement apparatus delivers a physical magnitude related to the angular displacement of the disk, thereby making it possible to deduce in particular the distance travelled by the rail vehicle, or the speed of said vehicle.

Usually, the measurement apparatus includes an optical detection assembly and is in the form of a preassembled module designed to be mounted on a free end of a bogie axle. The optical detection assembly and the disk are protected from dust and dirt by suitable sealing means. Such a pre-assembled module may advantageously be mounted on a bogie without disassembling said bogie.

In certain cases, it is unauthorized or impossible to mount the pre-assembled module on the free end of a bogie axle. Unfortunately, it is difficult to adapt such a module to enable it to be mounted on some other portion of the axle, in particular because such mounting is difficult, because it takes up space, and/or because of problems of protecting it from water, dust and dirt that might prevent the optical detection assembly from operating correctly.

SUMMARY OF THE INVENTION

An object of the invention is to enable apparatus that is capable of reliably measuring a physical magnitude related to rotation of the axle of a bogie to be mounted on said bogie without it being necessary to disassemble said bogie.

To this end, the invention provides a rail vehicle bogie of the above-mentioned type, said bogie being characterized in that the disk is made of metal, and in that the detection assembly comprises at least one inductive proximity detector.

According to other characteristics of the bogie:

it further comprises an electric motor for driving the axle, and a current return assembly for transferring the current coming from the motor to the axle, the current return assembly including a collector ring forming a shoulder secured to the axle, and the disk is fixed to the free face of the collector ring by means of screws that extend substantially perpendicularly to the faces of the disk and parallel to the axis of the axle, and by means of centering means for centering the disk relative to the axle.

the centering means comprise studs that extend substantially parallel to the axis of the axle or a shoulder on the disk, which shoulder co-operates with the inside contour of the collector ring;

the current return assembly comprises a fixed housing surrounding the collector ring and provided with a fixing flange, the detection assembly is carried by a fixed plate, and the fixing flange and the plate are connected by at least one common fixing member to a common support carried by the underframe;

the common fixing member comprises a pin provided with two threaded ends and with a drive body spacing apart the fixing flange and the plate, a first end of the pin passing through the fixing flange and being screwed into the common support, the second end of the pin passing through the plate and being screwed into a clamping nut;

the common support is a housing of a gearbox coupled to the electric motor;

the disk is covered with a protective cover connected to the plate;

the disk comprises at least two portions forming two sectors, each of which preferably extends over about 180°, the portions being connected together by screws and centering studs that extend substantially parallel to the faces of the disk;

the plate and the cover are elements each comprising at least two portions forming two sectors, each of which preferably extends over about 180°; and the perforation is defined by two substantially radial surfaces that converge towards that face of the disk which faces the detection assembly;

The invention also provides a method of machining the means for fixing the disk to the free face of the collector ring of the bogie as defined above, said method being characterized in that centering orifices are formed in the free face of the collector ring for the purpose of receiving the centering studs for centering the disk, or tapped orifices are formed in the free face of said collector ring for the purpose of receiving the fixing screws for fixing the disk, the orifices being formed by a drilling tool guided by drill bushes carried by a guide tool that is annular in overall shape, that is fixed temporarily, and that is centered relative to the axis of the axle.

According to another characteristic of the method, the guide tool is fixed either to the free face of the collector ring by means of screws screwed into already-existing tapped orifices in said free face, or to the common support by means of the common fixing member, in place of the plate.

The invention further provides a guide tool for implementing the method as defined above, said guide tool being characterized in that it comprises at least two portions forming two sectors, each of which extends preferably over about 180°.

BRIEF DESCRIPTION OF THE DRAWINGS

The invention will be better understood on reading the following description given solely by way of limiting example, and with reference to the accompanying drawings, in which:

FIG. 2 is a section view, on a larger scale, on line 2—2 of FIG. 1;

FIG. 3 is a view of the disk of the measurement apparatus, seen looking along arrow 3 of FIG. 4, with portions being shown in section;

FIG. 4 is a view looking along arrow 4 of FIG. 3;

FIG. 10 is a view similar to FIG. 2, but showing a variant embodiment of centering means for centering the disk relative to the axle of the bogie.

DETAILED DESCRIPTION OF THE INVENTION

Figure 1:
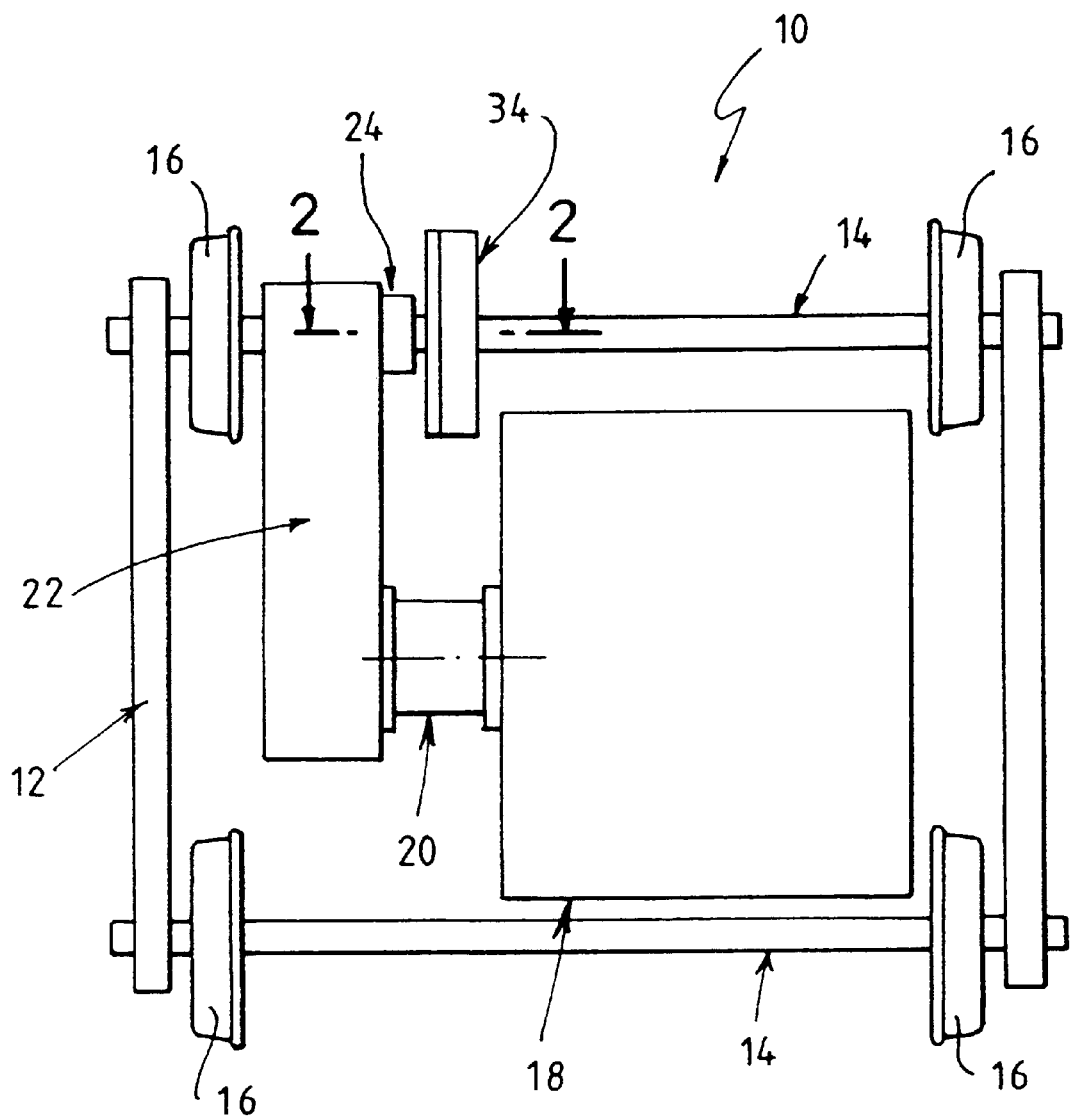
FIG. 1 is a diagrammatic view of a bogie of the invention.

FIG. 1 diagrammatically shows a rail vehicle bogie designated by overall reference 10.

In conventional manner, the bogie includes a fixed underframe 12 and a pair of axles 14 carrying wheels 16, the axles being rotatably mounted on the underframe 12. The bogie 10 further includes a conventional drive electric motor 18 connected to an axle 14 via coupling means 20 and a gearbox 22. The bogie 10 further includes a conventional assembly 24 for returning the power supply current from the motor 18. This assembly uses conventional rubbing electrical contact means to transfer the current coming from the motor 18 to the axle 14 coupled to the gearbox 22.

As shown in FIG. 2, the current return assembly 24 includes a collector ring 26 forming a shoulder secured to the axle 14. The current return assembly 24 also includes a fixed housing 28 surrounding the collector ring 26 and provided with a fixing flange 30. The flange 30 is fixed by means described below to a fixed housing 32 of the gearbox 22 carried by the underframe 12.

The bogie 10 further includes apparatus 34 for measuring a physical magnitude related to rotation of the axle 14. This measurement apparatus is shown in detail in FIGS. 2 to 4. The measurement apparatus 34 includes a metal disk 36 secured to the axle 14 and coaxial therewith.

The disk 36 includes a hub 38 and is provided with at least one perforation 40 forming a mark. Preferably, the disk 36 is provided n perforations 40 distributed uniformly around a circle centered on its axis, where n is a non-zero integer. For reasons of simplification, only three perforations 40 are shown in FIG. 3.

For example, the perforations may be formed by orifices passing through the thickness of the disk, as shown in particular in FIGS. 2 and 3, or by notches opening out at the periphery of the disk.

In order to enable it to be mounted around the axle 14, the disk 36 comprises at least two portions 36A, 36B forming two sectors, each of which preferably extends over about 180°, the two portions being connected together by a pair of screws 42, and by a pair of centering studs 44, the screws and the studs extending substantially parallel to the faces of the disk 36 (see FIG. 3).

The hub 38 of the disk is fixed to a free face of the collector ring 26 by means of screws 46 (represented diagrammatically by dot-dash lines in FIG. 4) and of centering studs 48, the screws and the studs extending substantially perpendicular to the faces of the disk 36 and parallel to the axis of the axle 14 (see, in particular, FIGS. 3 and 4).

In the example shown in the figures, the hub 38 of the disk is fixed to the collector ring 26 by means of four screws 46 and of two centering studs 48, namely two screws 46 and one centering stud 48 per portion 36A, 36B of the disk.

In a variant, the centering studs 48 can be replaced by other centering means 48 for centering the disk relative to the axle 14, e.g. a shoulder 49 machined in the hub 38 of the disk and co-operating with the inside contour of the collector ring 26, as shown in FIG. 10.

The measurement apparatus 34 further includes a fixed assembly 50 for detecting the perforations 40 in the disk 36.

Figure 7:
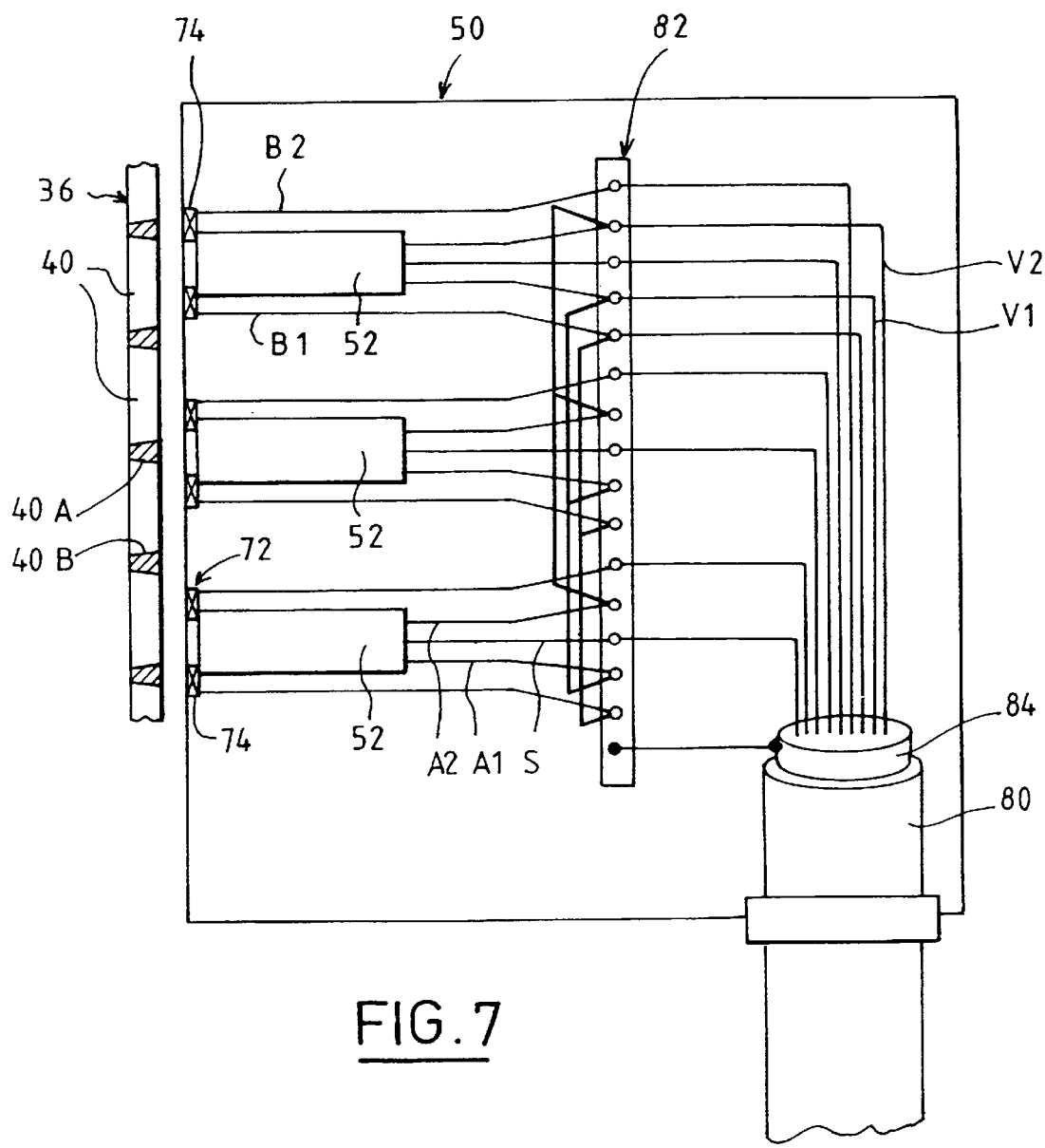
FIG. 7 is a diagrammatic view of the detection assembly carried by the bogie.

The detection assembly 50 is shown in more detail in FIG. 7, and it comprises at least one magnetic proximity detector 52, e.g. three such proximity detectors as shown or p such detectors, where p is a non-zero integer, uniformly distributed on a circular arc facing the perforations 40.

The detectors 52 are of known type, e.g. of the inductive type sold by OMROM ELECTRONICS under reference E2EG. Those inductive detectors operate using the principle of eddy currents.

The dimensions and the angular spacing of the perforations 40 and of the detectors 52 are such that there is always a detector 52 facing a perforation 40 regardless of the angular position of the disk relative to the detection assembly 50.

Preferably, in order to prevent dust from collecting in the perforations 40, each of the perforations is defined by two substantially radial surfaces 40A, 40B that converge towards that face of the disk 36 which faces the detection assembly 50, as shown in FIG. 7.

The detection assembly 50, which is described in more detail below, is carried by a fixed plate 54 (see FIG. 2). The plate 54 and the flange 30 of the housing 28 of the current return assembly are connected to the housing 32 of the gearbox by at least one common fixing member 56, and preferably by at least four such members. The housing 32 thus forms a support that is carried by the underframe of the vehicle and that is common to the plate 54 and to the flange 30 of the current return assembly.

Each fixing member 56 comprises a pin 58 provided with two threaded ends 58A, 58B and with a polygonal drive body 60 spacing the flange 30 apart from the plate 54. A first end 58A of the pin passes through the flange 30 of the housing 28 and is screwed into the housing 32 of the gearbox. The second end 58B of the pin passes through the plate 54 and is screwed into a clamping nut 62.

The disk 36 is covered with a protective cover 64 which is connected to the plate 54 in a manner known per se.

In order to enable them to be mounted around the axle 14, the plate 54 and the cover 64 are elements each made up of at least two portions 54A, 54B, 64A, 64B, forming two sectors preferably extending over about 180°.

It can thus be understood that the plate 54 and the cover 64 form a casing that protects the disk 36 and the detection assembly 50 from surrounding dust and dirt as well as from water spraying up under the bogie.

However, it can be noted that radial clearance 66 exists between the rotary axle 14 and the wall of the cover 64 through which the axle passes. This radial clearance 66 makes it possible to accommodate the manufacturing tolerances of the axle 14 and of the cover 64.

Any dust and dirt that penetrates via the clearance 66 into the casing formed by the plate 54 and by the cover 64 does not prevent the inductive proximity detectors 52 from operating properly, since they are much less sensitive to dust and dirt than are optical detectors. Furthermore, any water that penetrates into the casing drains away naturally via a hole 67 provided in the bottom of the cover 64 (see FIG. 2).

The cover 64 thus offers sealing that is sufficient to guarantee that the inductive proximity detectors 52 operate properly. It is therefore not necessary to use complex and voluminous sealing means such as those commonly associated with conventional optical detection assemblies.

A method of machining the means for fixing the disk 36 to the free face of the collector ring 26 is described below.

Figure 5:
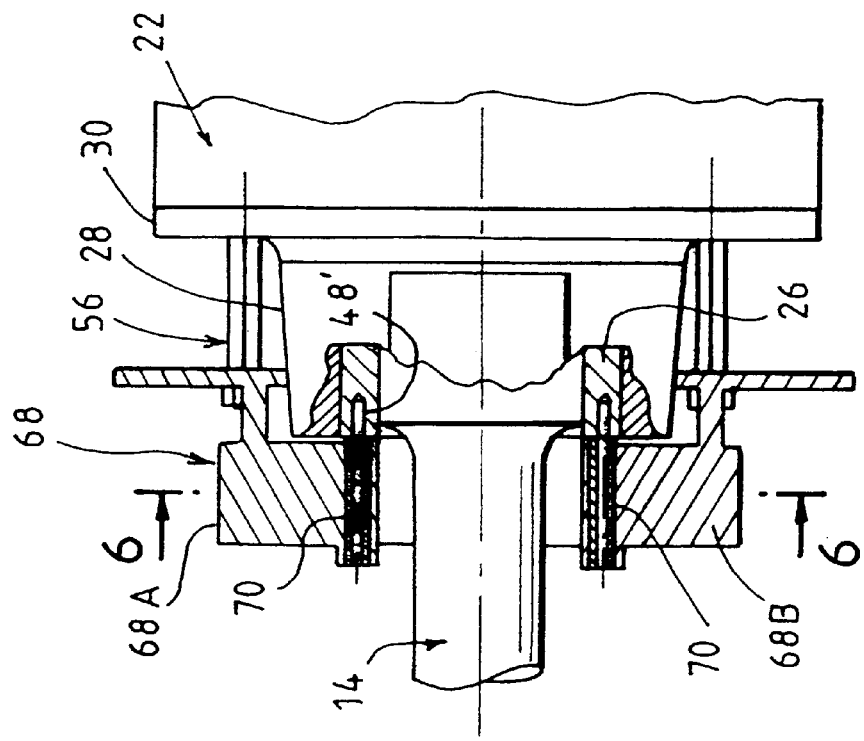
FIG. 5 is a view similar to FIG. 2, but showing a guide tool disposed in place of the disk.
Figure 6:
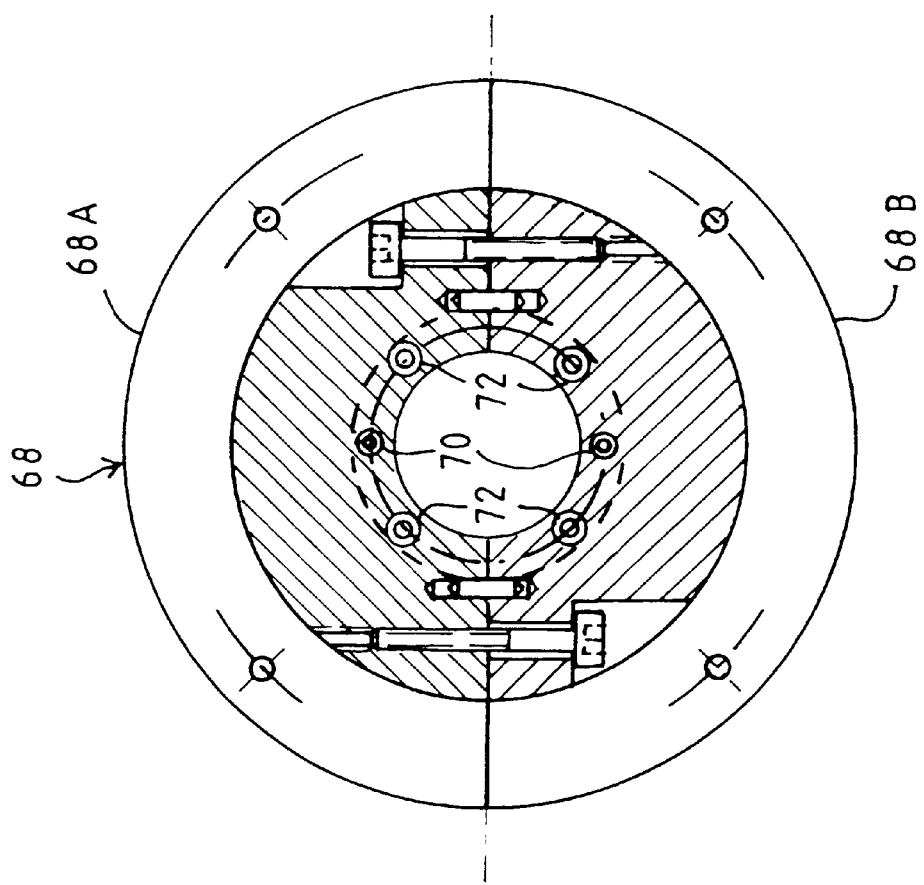
FIG. 6 is a section view on line 6—6 of FIG. 5.

Firstly, a guide tool 68 that is annular in overall shape (see FIGS. 5 and 6) is fixed temporarily to the housing 22 of the gearbox by means of common fixing members 56, and in place of the plate 54.

In order to enable it to be mounted around the axle 14, the tool 68 comprises at least two portions 68A, 68B forming two sectors, each of which preferably extends over about 180°. These two portions 68A, 68B are connected together by means analogous to those connecting together the two portions 36A, 36B of the disk (see FIG. 6).

The guide tool 68 is centered relative to the axis of the axle 14 by conventional means.

After the guide tool 68 has been fixed and centered, centering orifices 48' are formed in the free face of the collector ring 26 for the purpose of receiving the centering studs 48 for centering the disk (see FIG. 2), and, if they do not already exist, tapped orifices 46' are formed in said free face of the collector ring for the purpose of receiving the screws 46 for fixing the disk (see FIG. 4), the orifices being formed by means of a conventional drilling tool (not shown) guided by drill bushes 70, 72 carried by the guide tool 68.

Once the centering orifices 48' and the tapped orifices 46' have been drilled, the guide tool 68 is removed, and the disk 36 is fixed to the free face of the ring 26 using the above-described means.

In a variant, when the free face of the collector ring 26 is already provided with tapped orifices, the tapped orifices then form the orifices 46', and the machining tool 68 may be fixed temporarily to the free face of the ring by means of screws screwed into the already-existing tapped orifices, so that the centering orifices 48' can be formed.

It can be understood from the above, and more particularly from the above-described machining method, that the measurement apparatus 34 can be mounted on the bogie 10 without disassembling the bogie.

Figures 8, 9:
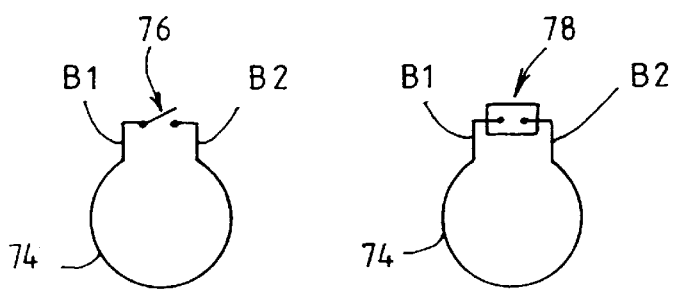
FIGS. 8 and 9 are diagrammatic views of a testing turn for testing a detector of the assembly shown in FIG. 7, the turn being connected to means for modifying its state respectively by short-circuiting it and by feeding it with current.

The detection assembly 50 is described in more detail below with reference to FIGS. 7 to 9.

It can be noted that the detectors 52 that are described are of the inductive type. However, any other type of magnetic detector may be used in the context of the invention, e.g. Hall effect detectors may be used.

In conventional manner, each inductive detector 52 is connected electrically to two electrical power supply conductors A1, A2, and to one output signal conductor S.

Each inductive detector 52 includes testing means 72 for checking that it is operating properly. These means 72 are provided outside the inductive detector, without any electrical connection or contact therewith.

Preferably, the testing means 72 comprise at least one conductive turn 74 surrounding an active end of the detector 52. The turn 74 is connected to means for modifying its state. For example, such state modification means may be constituted by conventional means for short-circuiting the turn 74, which means comprise, in particular, a switch 76, as shown in FIG. 8, or else by conventional means 78 for feeding current to the turn 74, as shown in FIG. 9.

In a variant, the turn 74 may be replaced with a conductive coil made up of a plurality of turns.

Each turn 74 is connected to an input conductor B1 and to an output conductor B2.

The set of conductors A1, A2, S, B1, B2 is connected to a multi-conductor cable 80 via a terminal strip 82.

It can be noted that the power supply conductors A1, A2 of the detectors 52 are connected in parallel to each other and to two power supply conductors V1, V2 of the cable 80. It can also be noted that the input conductors B1 of the turns 74 are connected to a common point of the terminal strip 82. Finally, it can be noted that the cable 80 is provided with shielding 84 which is also connected to the terminal strip 82.

Conventionally, each of the inductive detectors 52 comprises an oscillator (not shown) associated with an electronic detection circuit. The output signal emitted by the detector 52 is of the binary type (one high level and one low level). A metal element (a portion of disk between two perforations 40) going past the detector 52, modifies the state of the oscillator thereof, and causes a change in output signal level.

When a detector 52 is in operation, and when its active end is spaced apart from any interfering metal element, the state of the turn 74 associated with the detector being modified, by it being short-circuited or it being fed with current, causes a change in the output signal level, as would a metal element going past the detector 52.

The testing means 72 thus make it possible to test the measurement apparatus 34 in the following manner.

With the disk 36 stationary relative to the detection assembly 50, the state of the turn 74 of at least one detector in operation and facing a perforation 40 is modified using a reference sequence. It should be recalled that the dimensions and the angular spacing of the perforations 40 and of the detectors 52 are such that there is always a detector facing a perforation 40 regardless of the angular position of the disk 36 relative to the detection assembly 50.

The reference sequence is compared with the output signal of the detector under test to verify that the level of the signal changes in compliance with a sequence identical to the reference sequence. Otherwise, it can be concluded that the detector 52 under test is not operating properly.

It can be noted that the above-described method of testing a detector 52 makes it possible to detect any accidental displacement of the disk 36 because any such displacement generates disparity between the reference sequence and the sequence whereby the level of the output signal changes.

Any accidental displacement of a bogie, and thus of a rail vehicle, during the above method of testing a detector 52 is thus easy to detect.

The testing means 72 are independent of operation of the detectors 52, and they thus make is possible to test said detectors reliably and safely.

What is claimed is:

1. A rail vehicle bogie of the type comprising:
   a fixed underframe (12);
   at least one axle (14) rotatably mounted on the underframe (12); and
   measurement apparatus (34) for measuring a physical magnitude related to rotation of the axle (14), which measurement apparatus comprises a disk (36) secured to the axle (14) and provided with at least one mark-forming perforation (40), and a fixed detection assembly (50) for detecting the mark, which assembly is carried by the underframe;
   said bogie being characterized in that the disk (36) is made of metal, and in that the detection assembly (50) comprises at least one inductive proximity detector (52).

2. A bogie according to claim 1, characterized in that it further comprises:
   an electric motor (18) for driving the axle; and a current return assembly (24) for transferring the current coming from the motor (18) to the axle (14), the current return assembly (24) including a collector ring (26) forming a shoulder secured to the axle (14); and in that the disk (36) is fixed to the free face of the collector ring (26) by means of screws (46) that extend substantially perpendicularly to the faces of the disk (26) and parallel to the axis of the axle (14), and by means of centering means (48; 49) for centering the disk relative to the axle (14).

3. A bogie according to claim 2, characterized in that the centering means comprise studs (48) that extend substantially parallel to the axis of the axle (14) or a shoulder (49) on the disk (36), which shoulder co-operates with the inside contour of the collector ring (26).

4. A bogie according to any preceding claim 1, characterized in that the current return assembly (24) comprises a fixed housing (28) surrounding the collector ring (26) and provided with a fixing flange (30);

in that the detection assembly (50) is carried by a fixed plate (54); and in that the fixing flange (30) and the plate (54) are connected by at least one common fixing member (56) to a common support (32) carried by the underframe (12).

5. A bogie according to claim 4, characterized in that the common fixing member (56) comprises a pin (58) provided with two threaded ends (58A, 58B) and with a drive body spacing apart the fixing flange (30) and the plate (54), a first end (58A) of the pin passing through the fixing flange (30) and being screwed into the common support (32), the second end (58B) of the pin passing through the plate (54) and being screwed into a clamping nut (62).

6. A bogie according to claim 4, characterized in that the common support is a housing (32) of a gearbox (22) coupled to the electric motor (18).

7. A bogie according to claim 4, characterized in that the disk (36) is covered with a protective cover (64) connected to the plate (54).

8. A bogie according to any preceding claim 1, characterized in that the disk (36) comprises at least two portions (36A, 36B) forming two sectors, each of which preferably extends over about 180°, the portions being connected together by screws (42) and centering studs (44) that extend substantially parallel to the faces of the disk (36).

9. A bogie according to claim 7, characterized in that the plate (54) and the cover (64) are elements each comprising at least two portions (54A, 54B, 64A, 64B) forming two sectors, each of which preferably extends over about 180°.

10. A bogie according to any preceding claim, characterized in that the perforation (40) is defined by two substantially radial surfaces (40A, 40B) that converge towards that face of the disk (36) which faces the detection assembly (50).

11. A method of machining the means for fixing the disk (36) to the free face of the collector ring (26) of the bogie according to claim 2, said method being characterized in that centering orifices (48') are formed in the free face of the collector ring (26) for the purpose of receiving the centering studs (48) for centering the disk, or tapped orifices (46') are formed in the free face of said collector ring for the purpose of receiving the fixing screws (46) for fixing the disk (46), the orifices being formed by a drilling tool guided by drill bushes (70) carried by a guide tool (68) that is annular in overall shape, that is fixed temporarily, and that is centered relative to the axis of the axle (14).

12. A method according to claim 11, wherein the centering means comprise studs (48) that extend substantially parallel to the axis of the axle (14) or a shoulder (49) on the disk (36), which shoulder co-operates with the inside contour of the collector ring (26), and wherein the current return assembly (24) comprises a fixed housing (28) surrounding the collector ring (26) and provided with a fixing flange (30), said detection assembly (50) is carried by a fixed plate (54), and the fixing flange (30) and the plate (54) are connected by at least one common fixing member (56) to a common support (32) carried by the underframe (12), said method being characterized in that the guide tool (68) is fixed either to the free face of the collector ring (36) by means of screws screwed into already-existing tapped orifices in said free face, or to a common support (32) by means of the common fixing member (56), in place of the plate (54).

13. A guide tool for implementing the method according to claim 11, said guide tool being characterized in that it comprises at least two portions (68A, 68B) forming two sectors, each of which extends preferably over about 180°.

* * * * *